United States Patent
Guccione et al.

(10) Patent No.: US 6,216,259 B1
(45) Date of Patent: Apr. 10, 2001

(54) CONFIGURATION OF PROGRAMMABLE LOGIC DEVICES WITH ROUTING CORE GENERATORS

(75) Inventors: Steven A. Guccione, Austin, TX (US); Delon Levi, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/168,300

(22) Filed: Oct. 7, 1998

Related U.S. Application Data

(63) Continuation-in-part of application No. 08/919,531, filed on Aug. 28, 1997, now Pat. No. 6,078,736.

(51) Int. Cl.[7] .......................... G06F 17/50; H03K 17/693
(52) U.S. Cl. ................................. 716/17; 716/18
(58) Field of Search .................. 716/16, 17, 1, 716/18; 703/23, 14; 717/2

(56) References Cited

U.S. PATENT DOCUMENTS

| | | | |
|---|---|---|---|
| 5,109,353 | 4/1992 | Sample et al. | 364/578 |
| 5,337,255 | * 8/1994 | Seidel et al. | 716/17 |
| 5,422,833 | * 6/1995 | Kelem et al. | 703/14 |
| 5,469,003 | 11/1995 | Kean | 326/39 |
| 5,499,192 | 3/1996 | Knapp et al. | 364/489 |
| 5,684,980 | 11/1997 | Casselman | 395/500 |
| 5,734,866 | * 3/1998 | Greenbaum | 716/16 |
| 5,794,033 | 8/1998 | Aldebert et al. | 395/653 |
| 5,802,290 | 9/1998 | Casselman | 395/200 |
| 5,995,744 | * 11/1999 | Guccione | 703/23 |
| 6,074,432 | * 6/2000 | Guccione | 717/2 |
| 6,078,736 | * 6/2000 | Guccione | 716/16 |

FOREIGN PATENT DOCUMENTS

| | | |
|---|---|---|
| 0645723 | 3/1995 | (EP) . |
| 2306728 | 5/1997 | (GB) . |
| WO 9410627 | 11/1994 | (WO) . |

OTHER PUBLICATIONS

The University of Texas at Austin 1993, A data–Parallel Programming Model for Reconfigurable Architectures to Guccione et al.*

University of Essex 1994, Applying High–level Synthesis Techniques to FPGA–based Design to Istiyanto et al.*

Supercomputing Research Center 1993, FPGA Computing in a data Parallel C. To Gakhale et al.*

Department of computing Imerial College, London, England 1997, Compilation Tools for Run–time Reconfigurable Designs. For Luk et al.*

University des sci. Et. Tech. Du Languedoc, Montpellier, France 1995, Run Time Reconfiguration of FPGA for scanning Genomic DataBases, to Lemoine et al.*

Virginia Polytechnic Institute and State University 1996, Scheduling and Partitioning ANSI–C Programs onto Muti–FPGA CCM Architectures to Peterson et al.*

(List continued on next page.)

Primary Examiner—Matthew Smith
Assistant Examiner—Leigh Marie Garbowski
(74) Attorney, Agent, or Firm—LeRoy D. Maunu; Edel M. Young

(57) ABSTRACT

A system and method for configuration of a programmable logic device using routing cores. A program executing on a processor includes instructions that select functions to be provided by the programmable logic device. The instructions invoke functions from a library of logic and router core generators to define logic cores and router cores to inter-couple the logic cores. From the logic and router core definitions, the program utilizes a bit-stream library to generate programming bits. The programmable logic device is then loaded with the programming bits by the program.

20 Claims, 3 Drawing Sheets

OTHER PUBLICATIONS

"The Programmable Logic Data Book" copyright Sep. 1996, pp. 4–5 through 4–78, Xilinx, Inc., 2100 Logic Drive, San Jose, CA 95124.

"XC4000 Family Hard Macro Style Guide", published Sep. 3, 1991 and available from Xilinx, Inc., 2100 Logic Drive, San Jose, CA 95124.

"Xilinx Libraries Guide", published Oct. 1995, pp. 4–71 to 4–97, available from Xilinx, Inc., 2100 Logic Drive, San Jose, CA 95124.

"X–BLOX User Guide", published Apr., 1994, pp. 1–1 to 2–14 and 4–36 to 4–46, available from Xilinx, Inc., 2100 Logic Drive, San Jose, CA 95124.

"Core Solutions Data Book", copyright 1997, pp. 4–3 to 4–4 and 2–3 to 2–91, available from Xilinx, Inc., 2100 Logic Drive, San Jose, CA 95124.

"Automated Layout of Integrated Circuits", pp. 113–195 of "Design Systems for VLSI Circuits", edited by G. De Micheli, A. Sangiovanni–Vincentelli, and P. Antognetti, published 1987, by Martinus Nijhoff Publishers.

Lechner E. et al: "The Java Environment for Reconfigurable Computing" Field–Programmable Logic and Applications. 7th International Workshop, FPL '97. Proceedings, Field–Programmable Logic and Applications. 7th International Workshop, FPL '97. Proceedings, London, UK, 1–3 Sep. 1997, pp. 284–293, XP002086682 ISBN 3–540–63465–7, 1997, Berlin, Germany, Springer–Verlag, Germany.

Virtual Computer Corporation Press Release, High Performance Results with New Hardware Software Co–Design System, dated Jan. 21, 1997 downloaded from Internet.

Virtual Computer Corporation Internet item, "H.O.T. Works—The complete PCI–XC6200 Development System."

The University of Birmingham, "Derik—Introduction" with figure "Virtual Derik".

Xilinx, Inc., "The Programmable Logic Data Book," 1998, available from Xilinx, Inc., 2100 Logic Drive, San Jose, California 95124.

Xilinx, Inc., "The Programmable Logic Data Book, " Sep. 1996, available from Xilinx, Inc., 2100 Logic Drive, San Jose, California 95124. pp 4–251 to 4–286.

Patrice Bertin and Herve Touati, "PAM Programming Environments: Practice and Experience", Digital Equipment Corporation, Paris Research Laboratory, 85, avenue Victor Hugo, 92500 Rueil–Malmaison, France, IEEE Workshop on FPGAs for Custom Computing Machines, Apr. 10–13, 1994, Napa Valley, CA, pp. 133–138.

Alan Wenban and Geoffrey Brown, "A Software Development System for FPGA–Based Data Acquisition Systems", School of Electrical Engineering Cornell University, Ithaca, N.Y. 14853, IEEE Symposium on FPGAs for Custom Computing Machines, Apr. 17–19, 1996, Napa Valley, CA, pp. 28–37.

David A. Clark and Brad L. Hutchings, "Supporting FPGA Microprocessors through Retargetable Software Tools", Dept. of Electrical and Computer Engineering, Brigham Young, Univ., Provo, UT 84602, IEEE Symposium on FPGAs for Custom Computing Machines, Apr. 17–19, 1996, Napa Valley, CA, pp. 195–203.

Jeffrey M. Arnold, "The Splash 2 Software Environment", IDA Supercomputing Research Center, 17100 Science Dr., Bowie, MD 20715, IEEE Workshop on FPGAs for Custom Computing Machines, Apr. 5–7, 1993, Napa Valley, CA, pp. 88–93.

H. Hogl, A. Kugel, J. Ludvig, R. Manner, K. Noffz, R. Zoz, "Enable ++: A Second Generation FPGA Processor", Lehrstuhl fur Informatik V, Universitat Mannheim, IEEE Symposium on FPGAs for Custom Computing Machines, Apr. 19–21, 1995, Napa Valley, CA, pp. 45–53.

Beat Heeb, Cuno Pfister, "Chameleon: A Workstation of a Different Colour", Institut fur Computersysteme, ETH Zurich, CH–8092 Zurich, Switzerland, Second International Workshop on Field–Programmable Logic and Applications, Vienna, Austria, Aug./Sep. 1992, pp. 152–161.

"Hardware Debugger Reference/User Guide", published Oct., 1995, available from Xilinx, Inc., 2100 Logic Drive, San Jose, California 95124.

Nisbet and Guccione, "The XC6200DS Development System", Proceedings of the 7th International Workshop, on Field–Programmable Logic and Applications FPL '97, edited by W. Luk, P. Cheung, and M. Glesner, and published by Springer–Verlag, pp. 61–68.

Xilinx 1996 Data Book entitled "The Programmable Logic Data Book ", published Sep., 1996, available from Xilinx, Inc., 2100 Logic Drive, San Jose, California 95124, pp. 4–251 through 4–274.

* cited by examiner

CONFIGURATION OF PROGRAMMABLE LOGIC DEVICES WITH ROUTING CORE GENERATORS

RELATED PATENT APPLICATIONS

This patent application is a continuation-in-part of U.S. patent application Ser. No. 08/919,531 entitled, "METHOD OF DESIGNING FPGAS FOR DYNAMICALLY RECONFIGURABLE COMPUTING," filed on Aug. 28, 1997 by Steven A. Guccione now U.S. Pat. No. 6,078,736.

This application is also related to the following two commonly owned pending applications:

1. U.S. patent application Ser. No. 09/023,334 entitled "NETWORK CONFIGURATION OF PROGRAMMABLE CIRCUITS", filed Feb. 13, 1998 by Steven A. Guccione; and
2. U.S. patent application Ser. No. 09/049,891 entitled "CONTEXT-SENSITIVE SELF IMPLEMENTING MODULES" filed Feb. 27, 1998 by Eric F. Dellinger, James L. Hwang, Sujoy Mitra, Sundararajarao Mohan, and Ralph D. Wittig.

The contents of the above applications are incorporated herein by reference.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark office patent file or records, but otherwise reserves all copyright rights whatsoever.

FIELD OF THE INVENTION

The present invention generally relates to configuration of programmable logic devices, and more particularly, to run-time reconfiguration of programmable logic devices.

BACKGROUND OF THE INVENTION

Field programmable gate arrays (FPGAs), first introduced by XILINX in 1985, are becoming increasingly popular devices for use in electronics systems. In general, the use of FPGAs continues to grow at a rapid rate because FPGAs permit relatively short design cycles, reduce costs through logic consolidation, and offer flexibility in their reprogrammability. The capabilities of and specifications for XILINX FPGAs are set forth in "The Programmable Logic Data Book," published in 1998 by XILINX, Inc., the contents of which are incorporated herein by reference.

The field of reconfigurable computing has advanced steadily for the past decade, using FPGAs as the basis for high-performance reconfigurable systems. Run-Time Reconfigurable (RTR) systems distinguish themselves by performing circuit logic and routing customization at run-time. RTR systems using FPGAs are expected to result in systems that require less hardware, less software, and fewer input/output resources than traditional FPGA-based systems. However, scarcity of software that supports RTR is believed to be one reason that RTR has been outpaced by research in other areas of reconfigurable computing.

Whereas with traditional configuration of FPGAs the time taken to generate a programming bitstream is generally not real-time critical, with RTR systems, the time required to generate the programming bitstream may be critical from the viewpoint of a user who is waiting for the FPGA to be reconfigured. Thus, it may be acceptable to take hours to generate a programming bitstream using traditional configuration methods. In a run-time environment, however, it is expected that the reconfiguration process require no more than a few seconds or even a fraction of a second.

Reconfiguration of an FPGA may include reparameterizing various logic cores and rerouting connections between the logic cores. Parameterizable cores permit the user to enter information about the desired core, from which a customized circuit conforming to this information is constructed. An example of a parameterizable core is an adder core to produce an adder circuit. Example parameters include the size, for example, 4 bit, 8 bit, or 16 bit, and serial versus parallel.

Once reparameterized, the connections between cores and placement on the FPGA must be established. Routers in a traditional configuration process generally route connections for all the circuit elements. That is, these routers define connections for all the circuit elements in a design. Therefore, in an RTR environment, traditional reparameterization and routing methods are inappropriate given the real-time operating constraints.

A system and method that address the aforementioned problems, as well as other related problems, are therefore desirable.

SUMMARY OF THE INVENTION

In various embodiments, the invention comprises methods and systems for configuration and run-time reconfiguration of programmable logic devices using routing cores. In one embodiment, a method is provided for configuration of a programmable logic device, where the programmable logic device is coupled to a processor. A library that comprises logic core generators and one or more router core generators is used for configuration, and the method comprises executing a program on the processor, the program including instructions that select functions to be provided by the programmable logic device. One or more of the logic core generators, in response to the program, generate logic core definitions that define at least two logic cores; and the router generators, in response to the program, generate at least one router core definition that defines a coupling of the logic cores in the programmable logic device. From the logic and router core definitions, programming bits are generated and the programmable logic device is then loaded with the programming bits.

In another embodiment, a system for run-time reconfiguration of a programmable logic device is provided. The system comprises a processor arranged to host a program, where the program includes instructions that select functions to be provided by the programmable logic device. A library of logic core generators and router core generators is accessible to the application program and executable on the processor; and a programming bit generator is accessible to the application program for generation of programming bits in response to output of the logic core and router core generators. A programmable logic device is coupled to the processor and configurable with the programming bits.

An apparatus for configuration of a programmable logic device that is coupled to a processor is provided in another embodiment. The apparatus comprises: means for selecting functions to be provided by the programmable logic device with program instruction references to a library of logic core and router core generators; means for generating logic core definitions; means for generating router core definitions that define couplings between the logic cores in the programmable logic device; means for generating programming bits from the logic core definitions and router core definition; and means for loading the programmable logic device with the programming bits.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Various aspects and advantages of the invention will become apparent upon review of the following detailed description and upon reference to the drawings in which.

Figure 1:
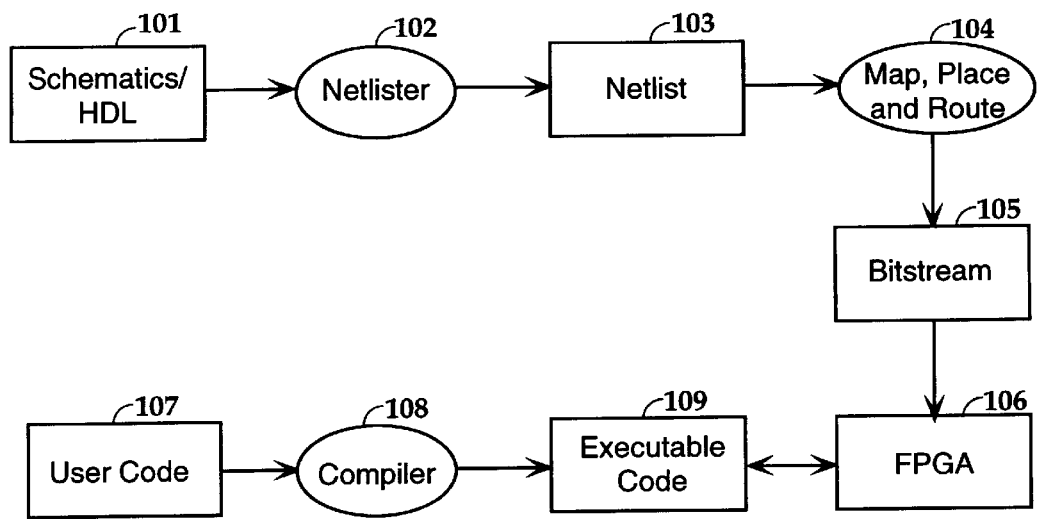
FIG. 1 is a bloc diagram that illustrates a prior art design flow.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

The present invention is believed to be applicable to a variety of configurable electronic systems. Such configurable electronic systems include, for example, mobile telephones, set-top boxes, computer systems and others as will be recognized by those skilled in the art. The present invention has been found to be particularly applicable and beneficial in electronic systems having programmable logic devices, for example, field programmable gate arrays (FPGAs). While the present invention is not so limited, an appreciation of the present invention is presented by way of a particular example application, in this instance, in the context of an example electronic system that includes a processor coupled to an FPGA.

Design of a circuit implemented in an FPGA using a reconfigurable logic coprocessor currently requires a combination of two distinct design paths, as shown in FIG. 1. The first and perhaps most significant portion of the effort involves circuit design using traditional CAD tools. The design path for these CAD tools typically comprises entering a design 101 using a schematic editor or hardware description language (HDL), using a netlister 102 to generate a net list 103 for the design, importing this netlist into an FPGA map, place, and route tool 104, which finally generates a bitstream file 105 of configuration data used to configure the FPGA 106.

Once the configuration data has been produced, the next task is to provide software to interface the processor to the FPGA. The user enters user code 107 describing the user interface instructions, which is then compiled using compiler 108 to produce executable code 109. The instructions in executable code 109 are then used by the processor to communicate with the configured FPGA 106. It is also known to use executable code 109 to control the configuration of FPGA 106 with bitstream file 105. This series of tasks is usually completely decoupled from the task of designing the circuit and hence can be difficult and error-prone.

In addition to the problems of interfacing the hardware and software in this environment, there is also the problem of design cycle time. Any change to the circuit design requires a complete pass through the hardware design tool chain (101–106 in FIG. 1). This process time is time consuming, with the place and route portion of the chain typically taking several hours to complete.

Finally, this approach provides no support for run-time reconfiguration. The traditional hardware design tools provide support almost exclusively for static design. It is difficult to imagine constructs to support run-time reconfiguration in environments based on schematic or HDL design entry.

Figure 2:
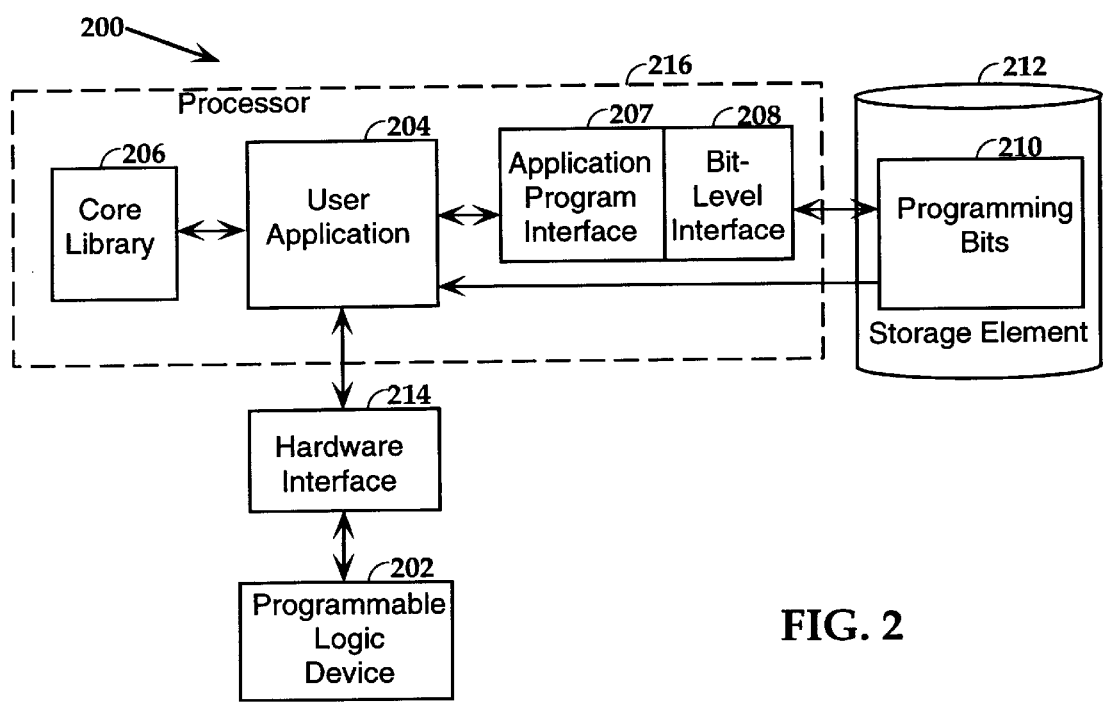
FIG. 2 is a block diagram of system for configuration of a programmable logic device, according to an example embodiment of the invention.

FIG. 2 is a block diagram of a system 200 for configuration of a programmable logic device 202, according to an example embodiment of the invention. It will be appreciated that the system 200 of FIG. 2 also supports run-time reconfiguration of the programmable logic device 202.

The system 200 includes a user application program 204 that is written in, for example, the Java® language. The application program 204 may be written to perform various functions relative to the environment in which the system 200 is used. For example, in addition to configuration and/or run-time reconfiguration of the programmable logic device 202, the user application program 204 may be programmed to provide user-interface functions and/or digital signal processing.

The core library 206 is a collection of macrocell or "core" generators that are implemented as Java classes. The cores are generally parameterizable and relocatable within a device. Examples of cores include counters, adders, multipliers, constant adders, constant multipliers, flip-flops and other standard logic and computation functions.

Application program interface 207 and bit-level interface 208 allow user application program 204 to write programming bits 210 to storage device 212. Application program interface 207 responds to high level commands from user application program 204 to implement desired functions in portions of programmable logic device 202. For example, user application program 204 might instruct application program interface 207 to implement an AND gate in logic block 3,4 of programmable logic device 202. Bit-level interface 208 includes a set of lower level functions, one or more of which are invoked when the user application program 204 references the application program interface 207. For example, in response to the command to implement an AND gate in block 3,4, bit-level interface 208 will write 0's and 1's to particular bits 210 of storage device 212. The set of functions in bit-level interface 208 manipulate selected ones of the programming bits 210, based on the type of programmable logic device to be configured. For example, some of the functions in the set may be programmed for certain devices in the XC4000EX family of FPGAs from XILINX, and others of the functions may programmed for other devices in the XC4000XL family. Bit-level interface software is generally understood by those skilled in the art. For example, bit-level interface software has been provided with the XC6200 series FPGA from XILINX.

The programming bits are stored in a storage element 212. Storage element 212 may be magnetic, optical, electronic, or a suitable combination thereof that is readable and writable.

While the core library 206, user application 204, application program interface 207, and bit-level interface 208 are written in Java in the example embodiment, it will be appreciated that many other languages would also be suitable.

Hardware interface 214 includes a portable layer of software and accompanying hardware to couple the user application program 204 to a programmable logic device 202. For example, the hardware interface 214 may be the Xilinx Hardware Interface (XHWIF) which is available from XILINX.

The processor 216 is coupled to the programmable logic device 202 via the hardware interface 214. The functional requirements of the system 200 dictate the particular style and capabilities of the processor 216. For example, some applications may call for a RISC based processor while others may call for a CISC. Various ones of special purpose or general purpose processors from manufacturers such as Intel, Sun Microsystems, Motorola, IBM, AMD and others may be suitable.

Figure 3:
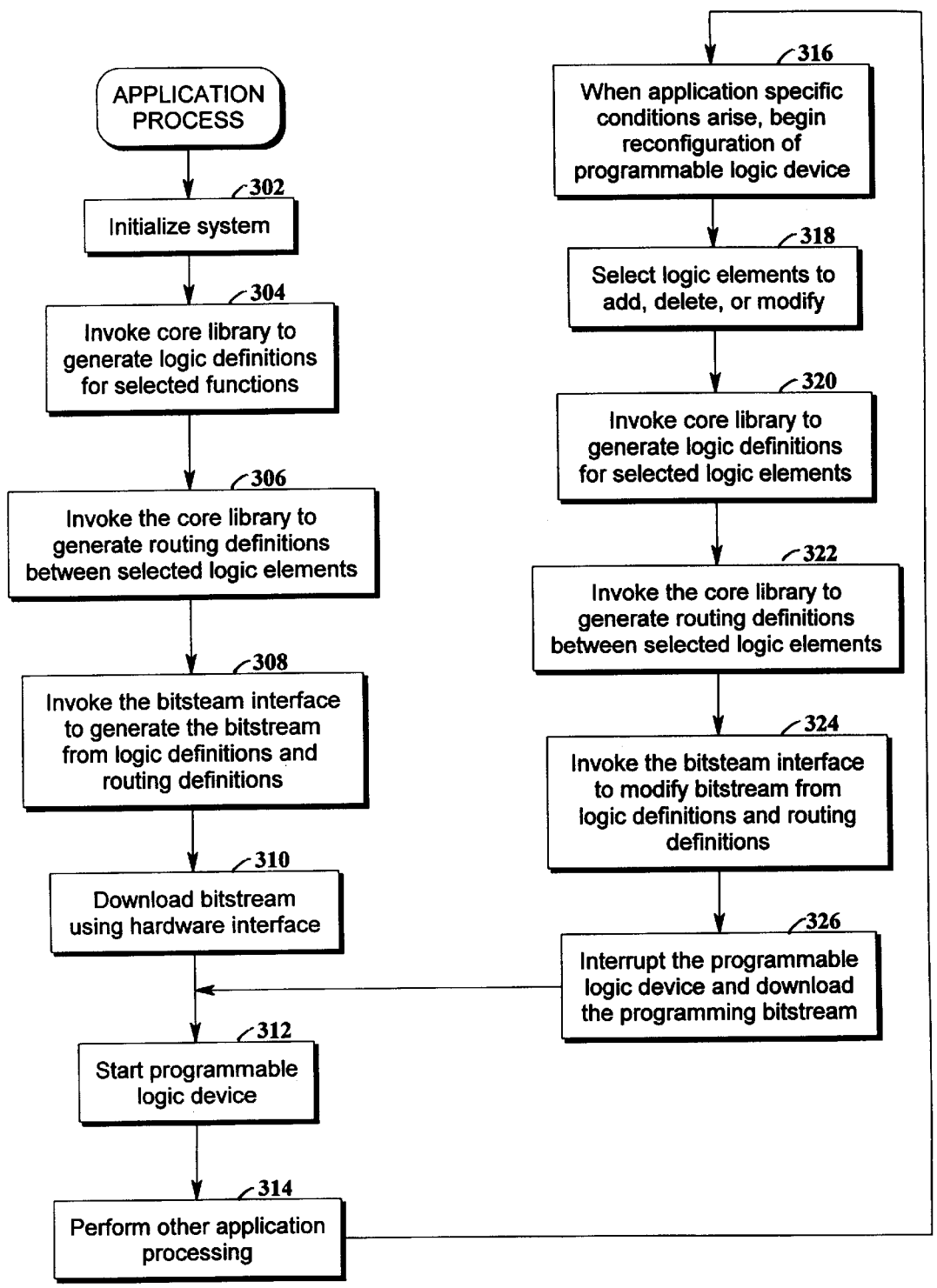
FIG. 3 is a flowchart of a process for initial configuration and run-time reconfiguration of a programmable logic device according to an example embodiment of the invention.

FIG. 3 is a flowchart of a process for initial configuration and run-time reconfiguration of a programmable logic device according to an example embodiment of the invention. In accordance with an example embodiment of the invention, the process can be implemented as an application program, for example, user application program 204 of FIG. 2. The example process proceeds in two example phases. In the first phase, the programmable logic device is initially configured, and in the second phase, the device is dynamically reconfigured in accordance with application processing requirements.

At step 302 various components in the example system, aside from the programmable logic device, are initialized. The example process then proceeds with configuration of the programmable logic device.

Selected functions provided by the core library 206 (FIG. 2) are invoked at step 304 to generate logic core definitions. The functions selected are those required to generate one or more logic cores for implementation on the programmable logic device. The functions are selected via execution of program instructions set forth in the example user application program 204. Examples set forth later in this specification will provide instructions for the user application program 204 and functions of the core library 206.

At step 306, selected functions of the core library are invoked to generate router cores. The router cores provide the information necessary to connect selected ones of the logic cores when the logic cores are implemented in the programmable logic device 202. Further details are provided in the example code segments that follow and also in FIG. 4. In various embodiments, the router cores can, for example, utilize the direct, single, double, quad, long, and global signal lines provided by the XC4000 family of FPGAs from XILINX.

Based on the generated logic cores and router cores, the application program interface 207 and bitstream interface 208 are invoked at step 308 to generate programming bits to configure the programmable logic device 202. The initial configuration bitstream is downloaded to the programmable logic device 202 at step 310, and the programmable logic device is made an operational component of the example system 200 at step 312.

Step 314 begins the run-time phase of processing by the application program 204. The example application program 204 includes code to monitor various application conditions, as illustrated at step 316. An example application provides adaptive digital filtering, which depends on various real-time system conditions. Run-time reconfiguration may also be initiated by, for example, user command line inputs, user GUI inputs, and the state or an action of the programmable logic device 202 itself.

At step 318, based on the information from step 316, the application program 204 selects the logic cores, which define the new circuit to be implemented. Steps 320, 322, 324, and 326 are similar to steps 304, 306, 308, and 310, respectively. However, the steps differ in that they can be performed while the example device 202 is providing its existing function.

It will be appreciated that downloading the bitstream as set forth in step 326 can involve either a partial reconfiguration or full reconfiguration of the programmable logic device 202. For example, the XC4000 series FPGAs from XILINX support only full reconfiguration, whereas the XC6200 FPGA and future devices available from XILINX support partial reconfiguration. If a small modification is being made to an existing bitstream, it is not necessary to rewrite the entire bitstream. Thus, the term "bitstream" is intended to encompass sequences of programming bits for both partial and full reconfiguration.

The discussion that follows is directed to implementing on an example FPGA an example counter and adder, and coupling the two logic cores. The coupling of the counter to the adder is accomplished using an example router core function in the core library 206.

A router core is generally used as follows. First the two logic cores to be connected are instantiated or "defined" using the appropriate generators from the core library 206. Then the programming bits instantiating these logic cores in their respective locations in the programming bitstream 210 are generated and stored using application program interface 207 and bit-level interface 208. Once the selected logic cores are instantiated, a router core is instantiated using the core library 206, and the associated programming bits are stored, again using application program interface 207 and bit-level interface 208.

The following code fragment, set off in italics, illustrates example instructions of a user application 204. The code includes instructions that build a 16-bit counter and a 16-bit adder that adds the value 7 to its input. The router core in the example connects the configurable logic block (CLB) YQ outputs of the counter to the F1 LUT inputs of the adder. Because the router core occupies no CLBs, it is treated as having no width, and is "set( )" to the same location as the constant adder. The "JBits" nomenclature corresponds to functions provided by the bit-level interface 208, and the term "stitcher" refers to generation of the router core.

```
/** © 1998 XILINX, INC. **/
/* set up the bit-level interface */
jb = new JBits(deviceType);
/* instantiate a 16-bit counter core at CLB(10,10) */
Counter counter = new Counter(16,5);
counter.set(jb, 10, 10);
/* instantiate a 16-bit +7 adder core at CLB(10,11) */
ConstAdder constAdder = new ConstAdder(16, 7);
constAdder.set(jb, 10, 11);
/* stitch the counter and adder together */
Stitcher stitcher = new Stitcher(Stitcher.F1_IN,
Stitcher.YQ_OUT, 16);
stitcher.set(jb, 10, 11);
```

Figure 4:
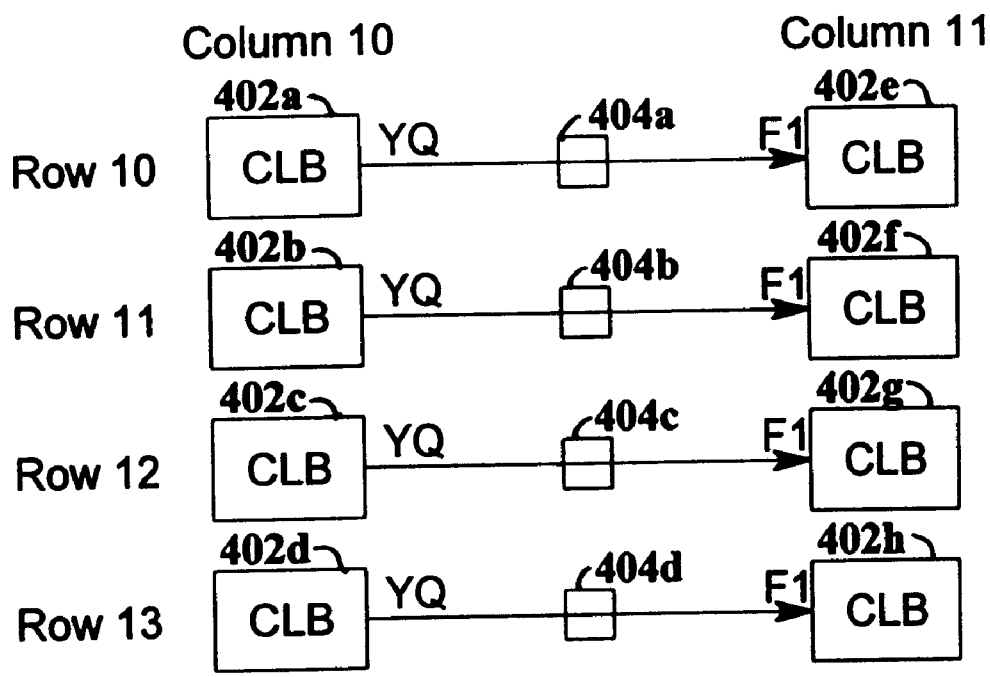
FIG. 4 is a schematic that illustrates a portion of an example FPGA configured in accordance with example program code fragments set forth in the description.

FIG. 4 is a schematic that illustrates a portion of an example FPGA configured in accordance with the example code fragment set forth above. The illustrated portion of the FPGA includes CLBs 402*a–d* at column 10, rows 10–13 and CLBs 402*e–h* at column 11 rows 10–13. CLBs 402*a–d* are configured to implement the counter, CLBs 402*e–h* are configured to implement the adder, and interconnect switches 404*a–d* are configured for coupling the counter CLBs to the adder CLBs. The router connections are, for example, direct connect signal lines for coupling adjacent CLBs in a XC4000 series FPGA. While direct connect switches are illustrated, it will be appreciated that more complex router cores could be implemented to make use of the aforementioned single, double, quad, long, and global signal lines, as well as programmable signal lines that are available in programmable logic devices from other manufactures. It will also be appreciated that different programmable logic devices from vendors other than XILINX could also make use of the present invention. As long as the architecture includes an array having blocks of logic and a distributed routing architecture, both of which are programmable, the invention is applicable. The invention is applicable to hierarchical architectures having blocks of blocks of logic.

Three code fragments are provided below to illustrate example Java classes provided by the core library 206. The first class illustrates a counter core, the second class illustrates a router core, and the third class illustrates a generic template that can be used as the starting point for creating additional objects in the core library 206. From these three classes, those skilled in the art will recognize how to implement additional cores for various functions and provide access to the architectural features of a programmable logic device 202.

The following class defines a counter. The counter implementation shown below consumes a single CLB per stage. It will be appreciated that alternative counter cores could be implemented which do not consume a single CLB per stage. Comments are interspersed with the code to explain the functionality.

```
/** © 1998 XILINX, INC. **/
public class Counter extends Core {
/** Local data */
private int size = 0;
private int init = 0;
/**
** This constructor sets up the counter core object. The
** size parameter defines the number of stages in
** the counter. The initial value of the counter is set
** to a default of zero.
**
** @param _size The number of stages in the counter
**
*/
public
Counter(int _size) {
    /* Default initial state to zero */
    init = 0;
    size = _size;
    /* Allocate the counter state object */
    state = new State(_size);
    /* Save the CLB width and height */
    clbHeight = _size;
    clbWidth = 1;
    /* Give the counter a default name */
    name = "Counter";
    } /* end Counter() */
/**
** This constructor sets up the counter core object. The
** size parameter defines the number of stages in
** the counter. The init parameter gives the
** initial value of the counter.
**
** @param _size The number of stages in the counter
**
** @param _init The initial value of the counter.
**
*/
public
Counter(int _size, int _init) {
    init = _init;
    size = _size;
    /* Allocate the counter state symbol */
    state = new State(_size);
    /* Save the CLB width and height */
    clbHeight = _size;
    clbWidth = 1;
    /* Give the counter a default name */
    name = "Counter";
    } /* end counter() */
/**
** See the set() function in the Core object
** for a description of this function.
**
```

```
** @see Core
**
*/
public int
set(JBits jb, int _clbRow, int _clbColumn) {
    int result;
    int bit;
    int i;
    int row;
    int col;
    /* F2 ^ F3 */
    int XOR[] = {0,1,1,0, 0,1,1,0, 0,1,1,0, 0,1,1,0};
    /* FI & F2 */
    int AND[] = {0,0,0,1, 0,0,0,1, 0,0,0,1, 0,0,0,1};
    /* Be sure we haven't written already */
    if (written == true)
        return (-1);
    /* Save the CLB row and column */
    clbRow = _clbRow;
    clbColumn = _clbColumn;
    /* The column does not change */
    col = clbColumn;
    bit = 0;
    for (row=clbRow; row<(clbRow+size); row++) {
        /* Set F LUT */
        if (row == clbRow) {
            result = jb.setF(row, col, LUT.INVERTER1);
            result = jb.setG(row, col, LUT.BUFFER1);
        } else {
            result = jb.setF(row, col, XOR);
            result = jb.setG(row, col, AND);
        }
        /* Set Y output to output of G LUT */
        result = jb.set(row, col, Y.OUT, Y.G);
        /* Set flip flop inputs (both from F LUT) */
        result = jb.set(row, col, YFF.D, YFF.F);
        result = jb.set(row, col, XFF.D, XFF.F);
        /* Set F2 and G2 inputs to Y output of CLB below (via
single wire) */
        result = jb.set(row, col, Y.HORIZ_SINGLE1, Y.ON);
        result = jb.set(row, col, F2.F2, F2.HORIZ_SINGLE1);
        result = jb.set(row, col, G2.G2, G2.HORIZ_SINGLE1);
        /* Set F1 and G1 inputs to XQ output of CLB (via single
wire) */
        result = jb.set(row, col, XQ.VERT_SINGLE1, XQ.ON);
        result = jb.set(row, col, F1.F1, F1.VERT_SINGLE1);
        result = jb.set(row, col, G1.G1, G1.VERT_SINGLE1);
        /* Set the inital state */
        if (((init >> bit) & 0x01) == 0) {
            result = jb.set(row, col, YFF.SR_SELECT, YFF.RESET);
            result = jb.set(row, col, XFF.SR_SELECT, XFF.RESET);
        } else {
            result = jb.set(row, col, YFF.SR_SELECT, YFF.SET);
            result = jb.set(row, col, XFF.SR_SELECT, XFF.SET);
        }
        /* Set flip flop clocks (shared) */
        result = jb.set(row, col, Clock.CLOCK, Clock.CLOCK4);
        /* Enable flip flop clocks */
        result = jb.set(row, col, YFF.DISABLE_CLOCK, YFF.OFF);
        result = jb.set(row, col, XFF.DISABLE_CLOCK, XFF.OFF);
        /* Set flip flops to latch mode */
        result = jb.set(row, col, YFF.LATCH, YFF.OFF);
        result = jb.set(row, col, XFF.LATCH, XFF.OFF);
        /* Set up state vector (all outputs use XQ) */
        state.setBitEntry(bit, row, col, State.XQ);
        bit++;
    } /* end for(col) */
    /* Set the written flag */
    written = true;
    return (0);
} /* end set() */
}; /* end class Counter */
```

The following code fragment sets forth an example Java class for implementing a router core that can be used to connect two adjacent logic cores, or other groups of adjacent CLBs. A left-to-right data flow is assumed. However, it will be appreciated that this class could be extended to support data flow in other directions. A stride bit of 1 is assumed, which means that each CLB row carries one bit of the data path.

Because of the geometry of the example supported devices, namely, the XC4000 family of devices, the only valid output resources are Y and YQ. The valid inputs are F1, C1, and G1. Selecting an input, an output and a size causes each selected output to be connected to a corresponding selected input.

This router core object has a width of zero because it consumes no CLB logic. This core uses the direct connect signal lines between CLBs. Note that since the present method replaces a more elaborate automatic routing algorithm, it is left to the user to ensure that these routing resources are not in use. Also note that the "set( )" function should be applied to the desired core input because, since the input row and column is specified in the set( ) function, the routing is more closely associated with inputs than outputs.

```
/** © 1998 XILINX, INC. **/
public class Stitcher extends Core {
/** The CLB input resources **/
public final static int G1_IN = 0;
public final static int C1_IN = 1;
public final static int F1_IN = 2;
/** The CLB output resources **/
public final static int Y_OUT = 3;
public final static int YQ_OUT = 4;
/** Local data **/
private int input = -1;
private int output = -1;
private int size = 0;
/**
** This constructor sets up the Stitcher core object.
**
** @param _input This is the CLB input signal to which
**     outputs from the CLB to the left are to be
**     connected.
**     Valid values are G1, C1 and F1.
**
** @param _output This is the CLB output signal to which
**     the CLB inputs are to be connected. Note that
**     these output signals are from the CLB to the
**     left. Valid Values are X, XQ, Y and YQ.
**
** @param _size The number of stages in the counter
**
*/
public
Stitcher(int _input, int _output, int _size) {
    /* Save local variables */
    input = _input;
    output = _output;
    size = _size;
    /* Save the CLB width and height */
    clbHeight = _size;
    clbWidth = 0; /* Always zero */
    /* Give the router a default name */
    name = "Stitcher";
    } /* end Stitcher() */
/**
** See the set() function in the Core object
** for a description of this function.
**
** @see Core
**
*/
public int
set(JBits jb, int _clbRow, int _clbColumn) {
    int result;
    int i;
    int row;
    int col;
    /* Be sure we haven't written already */
    if (written == true)
        return (-1);
    /* Save the CLB row and column */
    clbRow = _clbRow;
    clbColumn = _clbColumn;
```

-continued

```
    /* The column does not change */
    col = clbColumn;
    for (row=clbRow; row<(clbRow+size); row++) {
        /* There are 6 possible settings */
        /* (all combinations of inputs and outputs) */
        if ((output == YQ_OUT) && (input == G1_IN)) {
            result = jb.set(row, col, G1.G1, G1.OFF);
            result = jb.set(row, col, YQ.G1, YQ.ON);
            } else
        if ((output == YQ_OUT) && (input == C1_IN)) {
            result = jb.set(row, col, C1.C1, C1.OFF);
            result = jb.set(row, col, YQ.C1, YQ.ON);
            } else
        if ((output == YQ_OUT) && (input == F1_IN)) {
            result = jb.set(row, col, F1.F1, F1.OFF);
            result = jb.set(row, col, YQ.F1, YQ.ON);
            } else
        if ((output == Y_OUT) && (input == G1_IN)) {
            result = jb.set(row, col, G1.G1, G1.OFF);
            result = jb.set(row, col, Y.G1, Y.ON);
            } else
        if ((output == Y_OUT) && (input == C1_IN)) {
            result = jb.set(row, col, C1.C1, C1.OFF);
            result jb.set(row, col, Y.C1, Y.ON);
            } else
        if ((output == Y_OUT) && (input == F1_IN)) {
            result = jb.set(row, col, F1.F1, F1.OFF);
            result = jb.set(row, col, Y.F1, Y.ON);
            } else
            return (-1);
        } /* end for(col) */
    /* Set the written flag */
    written = true;
    return (0);
    } /* end set() */
} /* end class Stitcher */
```

The following code fragment serves as a template for dynamically parameterizable, relocatable cores in the core library 206. This core is implemented as an abstract Java class and is not functional by itself. It can be used as a template to create additional core objects in the library 206.

Because this is an abstract class, no constructor is supplied, however, each implemented core object must provide a constructor. The constructor sets the local variables that define the ClbWidth, ClbHeight, the Name, the State symbol, and any other data that may be required by the core. Note that no actual circuit implementation is done by the constructor; only local parameters are defined. All circuit construction should take place in the set( ) function, which writes configuration information directly into the bitstream.

Each core in the library is preferably a separate object that can only be set( ) once. While the constructor and the set( ) function could be merged, the separation is believed to produce better core objects. Core definition is separated from core implementation, and correct usage of parameters is promoted by this structure.

```
/** © 1998 XILINX, INC. **/
public abstract class Core {
/** Local data **/
/* The size of the Core */
protected int clbWidth = 0;
protected int clbHeight = 0;
/* The Core origin location */
protected int clbRow = -1;
protected int clbColumn = -1;
/* The Core state */
protected State state = null;
/* The Core name indentifier */
```

```
protected String name = "Undefined";
/* The written flag (so each object is only set() once) */
protected boolean written = false;
/**
**
** This function does nearly all of the work in building a
** JBits Core. It configures all CLBs and performs all
** routing. This definition of the core circuit is done
** at run-time and data is written directly into the
** JBits configuration. This function uses any local
** data supplied to the Core constructor as parameters.
** Note that the amount of parameterization possibie in a
** circuit is not limited by this approach. Any number or
** range of parameters may be supported in this manner.
** Note that it is also the responsibility of this function
** to:
**
** Return an error if the written flag is true
** Store the row and column origin of the core
**    for future reference
** Construct the State object
** Configure the Core into a JBits object
** Set the written flag to true.
**
**
** @param jb This is the JBits object representing
**     the selected device configuration.
**
** @param clbRow This is the CLB row at which to locate
**     the Core. By convention, the origin is in the
**     lower left corner of the Core.
**
** @param clbColumn This is the CLB column at which to
**     locate the Core. By convention, the origin is
**     in the lower left corner of the Core.
**
** @return This function returns a 0 on success and a
**     negative error code on failure.
*/
public abstract int set(JBits jb, int _clbRow, int
_clbColumn);
/*
** Non-abstract functions
**
*/
/**** This function returns the name of the core. This name
is a text ** String with no specific meaning. It is used
primarily for
** debugging purposes.
**
** @return This function returns the name of the Core.
**
*/
public String
getName() {
    return (name);
    } /* end getName() */
/**
** This function returns the width of the core in CLBs.
**
** @return This function returns the width of the core in
** CLBs.
**
** @see getClbHeight
**
/*
public int
getClbWidth() {
    return (clbWidth);
    } /* end getclbWidth() */
/**
** This function returns the height of the Core in CLBs.
**
** @return This function returns the height of the Core in
** CLBs.
**
** @see getClbWidth
**
*/
```

```
public int
getClbHeight() {
    return (clbHeight);
    } /* end getclbHeight() */
/**
** This function returns the row in the CLB array which
** contains the origin of the Core. By convention the
** origin of the core is in the lower left corner.
**
** @return This function returns row origin of the Core.
**
** @see getClbColumn
**
*/
public int
getClbRow() {
    return (clbRow);
    } /* end getClbRow() */
/**
** This function returns the column in the CLB array which
** contains the origin of the Core. By convention the
** origin of the core is in the lower left corner.
**
** @return This function returns column origin of the
** Core.
**
** @see getClbRow
**
*/
public int
getClbColumn() {
    return (clbColumn);
    } /* end getClbColumn() */
/**
** This function returns the state of the core as defined
** in the state object. The state is read back from the
** configuration data in the JBits object <em>jb</em>.
**
** @param jb The JBits object containing the
** configuration data.
**
** @return This function returns state of the Core.
**
/*
public long
getState(JBits jb) {
    return (state.get(jb));
    } /* end getState() */
}; /* end class Core */
```

Accordingly, the present invention provides, among other aspects, a method and system for configuration and run-time reconfiguration of programmable logic devices. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for configuration of a programmable logic device that is coupled to a processor using a library that comprises logic core generators and one or more router core generators, each of the logic and router core generators including code that is executable and embodies design information, comprising the steps of:

executing a program on the processor, the program including instructions that reference selected ones of the logic core generators for functions to be provided by the programmable logic device;

generating by one or more of the logic core generators in response to the program, logic core definitions that define at least two logic cores;

generating by the router generators in response to the program, at least one router core definition that defines a coupling of the logic cores in the programmable logic device;

generating programming bits from the logic core definitions and router core definition in response to the program; and loading the programmable logic device with the programming bits in response to the program.

2. The method of claim 1, further comprising specifying placement information for the logic cores to the logic core generators.

3. The method of claim 2, wherein the placement information includes a row and a column in a matrix of configurable units.

4. The method of claim 2, further comprising specifying connections for input resources of a first one of the logic core generators to output resources of a second one of the logic core generators.

5. The method of claim 1, further comprising programming the processor with instructions of a selected language to provide a plurality of functions, wherein configuration of the programmable logic device with the library of generators is one of the selected functions.

6. The method of claim 5, wherein the processor is further programmed for:

monitoring selected operating conditions;

generating new programming bits in response to selected operating conditions; and loading the programmable logic device with the new programming bits.

7. The method of claim 1, wherein the logic and routing generators are Java objects.

8. The method of claim 1, wherein the programmable logic device is a FPGA.

9. The method of claim 8, wherein the router core definition defines a coupling using a signal line selected form the group of direct, single, double, quad, long, and global signal lines.

10. A system for run-time reconfiguration of a programmable logic device, comprising:

a library of logic core generators and router core generators accessible for initiation by the application program and executable on the processor, each of the logic and router core generators including code that is executable and that embodies design information;

a processor hosting a run-time reconfiguration program, the program including instructions that reference selected ones of the logic and router core generators;

a programming bit generator accessible for initiation by the run-time reconfiguration program and arranged for generation of programming bits in response to output of the logic core and router core generators;

a programmable logic device coupled to the processor and configurable with the programming bits.

11. The system of claim 10, further comprising means for placement of the logic cores in the programmable logic device.

12. The system of claim 11, further comprising means for coupling input resources of a first one of the logic core generators to output resources of a second one of the logic core generators.

13. The system of claim 10, wherein the program includes instructions of a selected language arranged to provide a plurality of functions, wherein configuration of the programmable logic device with the library of generators is one of the selected functions.

14. The system of claim 13, wherein the program includes instructions arranged to:

monitor selected operating conditions;

generate new programming bits in response to selected operating conditions; and load the programmable logic device with the new programming bits.

15. The system of claim 10, wherein the logic and router core generators are Java objects.

16. The system of claim 10, wherein the programmable logic device is an FPGA.

17. An apparatus for configuration of a programmable logic device that is coupled to a processor, comprising:

means for selecting functions to be provided by the programmable logic device with program instruction references to selected logic core generators and router core generators in a library of core generators, each of the logic and router core generators including code that is executable and that embodies design information;

means for generating logic core definitions by the selected logic core generators;

means for generating by the selected router core generators router core definitions that define couplings between the logic cores in the programmable logic device;

means for generating programming bits from the logic core definitions and router core definition; and means for loading the programmable logic device with the programming bits.

18. A method of configuring a field programmable gate array (FPGA), the FPGA being connected to a host processor for configuration thereby, comprising the steps of:

a) programming the host processor with instructions in a high level programming language;

b) instantiating first and second logic elements from a library of elements compatible with the high level programming language, the first and second logic elements defining first and second functions, respectively;

c) instantiating a routing element from the library of elements compatible with the high level programming language, the routing element defining a route between the first and second logic elements;

d) providing a compiler for the high level programming language to the host processor for generating executable code in response to the programmed instructions and the instantiated library elements, the executable code including compiled placement and routing information;

e) configuring the FPGA from the host processor in response to the executable code.

19. The method of claim 18, wherein the FPGA is used for dynamically reconfigurable computing.

20. The method of claim 19, wherein the logic elements and routing element are parameterizable.

* * * * *